(12) United States Patent
Daehn et al.

(10) Patent No.: US 6,359,820 B2
(45) Date of Patent: Mar. 19, 2002

(54) INTEGRATED MEMORY AND METHOD FOR CHECKING THE OPERATION OF MEMORY CELLS IN AN INTEGRATED MEMORY

(75) Inventors: Wilfried Daehn, Celle; Wolfgang Helfer, München, both of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/826,233

(22) Filed: Apr. 4, 2001

(30) Foreign Application Priority Data

Apr. 4, 2000 (DE) .......................................... 100 16 719

(51) Int. Cl.[7] ................................................ G11C 7/00
(52) U.S. Cl. ...................................................... 365/201
(58) Field of Search .............................. 365/200, 201, 365/230.03

(56) References Cited

U.S. PATENT DOCUMENTS 5,818,771 A * 10/1998 Yasu et al. .................. 365/201
5,818,772 A 10/1998 Kuge .......................... 365/201

OTHER PUBLICATIONS

Published International Application No. WO 98/03979 (Ramseyer et al.), dated Jan. 29, 1998.
"A Flexible Redundancy Technique for High–Density DRAM's" (Horiguchi et al.), dated 1991, IEEE Journal of Solid–State Circuits, vol. 26, No. 1, Jan. .

* cited by examiner

Primary Examiner—Vu A. Le
(74) Attorney, Agent, or Firm—Herbert L. Lerner; Laurence A. Greenberg; Werner H. Stemer

(57) ABSTRACT

An integrated memory has addressable memory cells combined into groups of column lines and row lines. The addresses of the memory cells each include a first address part addressing the respective groups of column lines and row lines. In a method for checking operation, the memory cells are successively tested in the intersection of two groups to ensure that there are no faults. Memory cells in another group are then tested. If a match between compared first address parts of faulty memory cells exists, the address of at least one of the faulty memory cells is processed further for evaluation purposes, and the addresses of other faulty memory cells are not processed further. This permits extensive compaction of addresses of faulty memory cells.

17 Claims, 4 Drawing Sheets

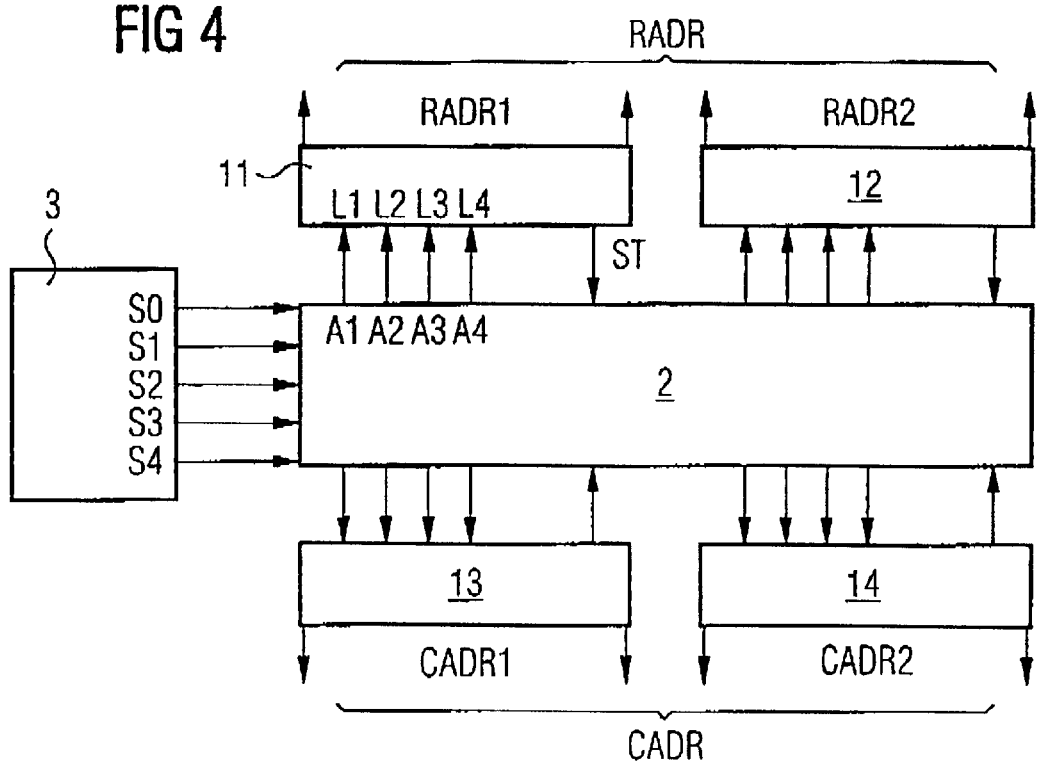
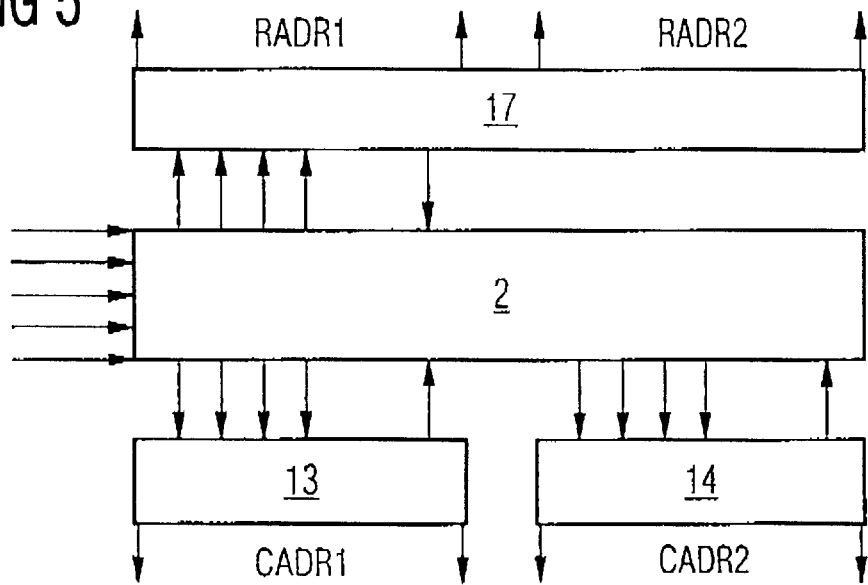

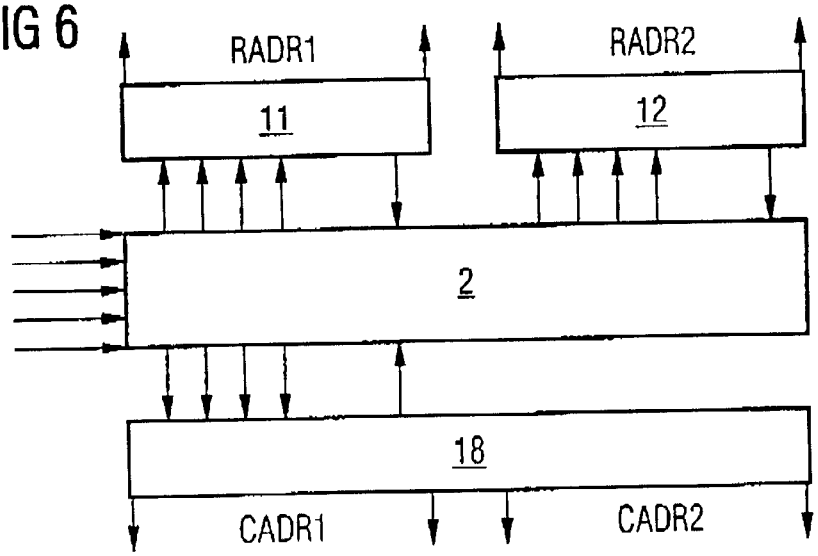
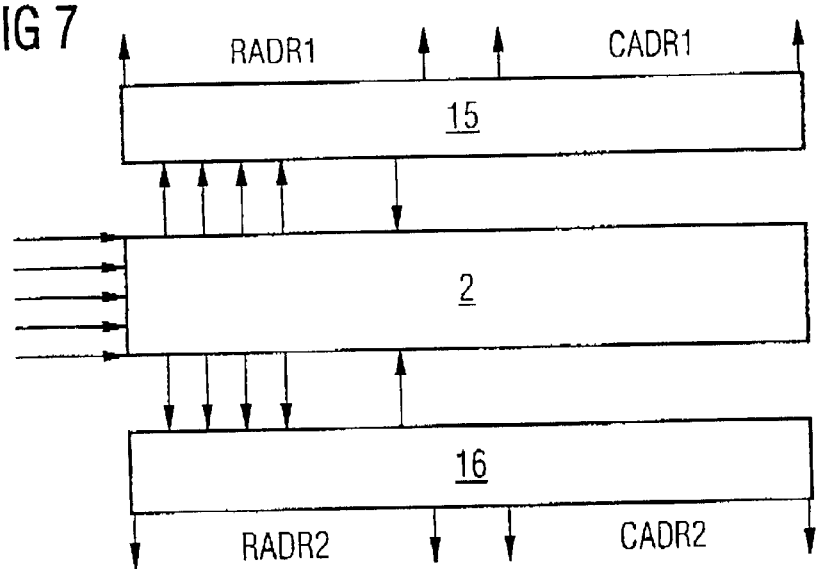

INTEGRATED MEMORY AND METHOD FOR CHECKING THE OPERATION OF MEMORY CELLS IN AN INTEGRATED MEMORY

BACKGROUND OF THE INVENTION

Field of the Invention

The present invention relates to an integrated memory that can be subjected to a memory cell test in order to ascertain operable and faulty memory cells and has addressable memory cells that are configured in a matrix-like memory cell array along column lines and row lines and are combined to form groups of column lines and row lines. The invention also relates to a method for checking the operation of memory cells in such a memory.

To check the operability of memory cells in an integrated memory, the integrated memory is generally subjected to a memory cell test. During such a test mode for checking memory cells, test data are written to each individual memory cell and are read out again, for example. A comparison between the written data and the data that is read out again indicates whether there is an operating fault in a tested memory cell.

Usually, integrated memories have memory cells configured in a matrix-like memory cell array along column lines and row lines. In this case, the memory cells are combined to form groups of column lines and row lines, for example. In the case of normal redundancy concepts for repairing semiconductor memories, a group of column lines or row lines of the memory cell array is always replaced when there is a fault in a memory cell or in a memory word, which includes a group of memory cells. In terms of a row or column repair to be chosen, the memory cells or memory words situated in the region of intersection of a group of row lines and a group of column lines are equivalent. This means that these memory cells can be repaired by a group of redundant column lines or by a group of redundant row lines.

A repair is initiated if one or more arbitrary memory cells or memory words in the region of intersection fail. To derive the repair information, by way of example, the addresses of the faulty memory cells or the addresses of faulty memory words, also called fault addresses, are stored and processed further for evaluation purposes.

An external test device or a self test unit tests the memory chip by alternately writing and reading data to/from the memory cells of the chip in a particular address sequence and comparing the data with expected data. In this context, an address generator has the task of generating the respective addresses for the write or read operations. The fault information obtained with each accompanying comparison operation can easily be accumulated. By way of example, as soon as a fault has arisen, a "fault flag" is set that marks the chip as faulty. If the chip is to be repaired, however, the information about which memory cell is faulty needs to be forwarded to a redundancy analysis unit on or outside the chip. These fault data are used to derive the repair information. To keep down the associated necessary transmission time or channel capacity or signal width for the signal which is to be transmitted, it is expedient for the fault data, for example in the form of fault addresses, to be compressed beforehand, taking account of the redundancy concept of the memory chip.

SUMMARY OF THE INVENTION

It is accordingly an object of the invention to provide an integrated memory and a method for checking the operation of memory cells in an integrated memory that overcomes the hereinafore-mentioned disadvantages of the heretofore-known devices of this general type, that checks the operation of memory cells in an integrated memory and that permits extensive compaction of addresses of faulty memory cells.

With the foregoing and other objects in view, there is provided, in accordance with the invention, a method for checking the operation of memory cells in an integrated memory. The method includes providing an integrated memory having addressable memory cells in a matrix-like memory cell array along column lines and row lines. The memory cells combine to form groups of column lines and row lines, each being addressed using column addresses and row addresses. The column addresses and row addresses each include a first address part addressing the respective groups of column lines and row lines. The next step of the method is testing successively the memory cells in an intersection of one of the groups of column lines and one of the groups of row lines for faults, and then testing memory cells of another group of column lines or row lines. The next step of the method is comparing faulty respective first address parts of the memory cells recognized as being faulty. The next step of the method is processing further the address of a faulty memory cell if the respective first address parts of the faulty memory cells matches another first address part of another faulty memory cell, and not processing further the addresses of other faulty memory cells.

In accordance with a further feature of the invention, the invention of the instant application specifies an integrated memory of the type mentioned in the introduction that permits extensive compaction of addresses of faulty memory cells when carrying out a method for checking the operation of memory cells.

With the objects of the invention in view, there is also provided an integrated memory that can be subjected to a memory cell test in order to ascertain operable and faulty memory cells. The integrated memory includes addressable memory cells in a matrix-like memory cell array. The addressable memory cells are disposed along column lines and row lines. The memory cells combine to form groups of column lines and row lines, each of which are addressed using respective column addresses and row addresses. The column addresses and the row addresses each include a first address part addressing a respective group of the column lines and the row lines, and a second address part addressing memory cells within the respective group. A respective counter generates the first address part and a respective further counter generates the second address part. Each of the counters has control inputs connected to outputs of an addressing unit. The respective first address parts and second address parts of the memory cells to be tested can be tapped off at the output of a respective counter. The addressing unit drives the counters for the purpose of addressing memory cells which are to be tested, such that the memory cells in an intersection of one of the groups of column lines and of one of the groups of row lines are successively addressed. Then, memory cells having another group of column lines or row lines are addressed.

Regarding the method, the object is achieved by a method for checking the operation of memory cells in an integrated memory in which the memory cells each can be addressed using column addresses and row addresses. The column addresses and row addresses of the memory cells each include a first address part addressing the respective groups of column lines and row lines. The method includes the following steps.

Memory cells in the region of intersection of one of the groups of column lines and one of the groups of row lines are successively tested to ensure that there are no faults. Then, memory cells of another group of column lines or row lines are tested.

In the next step, respective first address parts of the memory cells recognized as being faulty are compared.

In the next step, if the respective first address parts of faulty memory cells match, the address of at least one of the faulty memory cells is processed further as the result of the operation check for evaluation purposes. Then, the addresses of other faulty memory cells are not processed further.

In accordance with a further mode of the invention, the memory cells of the integrated memory can each be addressed using column addresses and row addresses. The column addresses and row addresses each include a first address part. The first address part can be used to address the respective groups of column lines and row lines, and a second address part. The second address part can be used to address the memory cells within the respective group having an addressing unit for addressing memory cells which are to be tested, having a respective counter for generating the first address part, and a respective further counter for generating the second address part. Each of which have control inputs connected to outputs of the addressing unit. In these, the respective address parts of the memory cells that are to be tested can be tapped off at the output of the respective counter.

Memory cells or memory words (groups of memory cells) from the same region of intersection are distinguished in that, with the exception of the less significant row and column address bits (second address part), which determine the position within the respective group, they have identical row and column addresses (first address part). In this case, the addresses of faulty memory cells or memory words (fault addresses) can be compressed by comparing successive fault addresses, or first address parts thereof, with one another and no longer forwarding the second and other fault addresses, for example, to a redundancy analysis unit if they belong to the same region of intersection of a group of column lines and a group of row lines as the first fault address which arose.

In this context, a fault address is processed further as the result of the operation check for evaluation purposes. The result can be assessed as "pass-fail information", for example. It is also possible to establish which of the memory cells are faulty. This can be used as information for subsequent repair of the memory.

For this case, a redundancy concept applied after the operation test stipulates that a group of column lines or a group of row lines is always replaced when there is a fault in a memory cell or in a memory word. A repair is initiated if one or more arbitrary memory cells in the relevant region of intersection are faulty. This means that the information about other faulty memory cells in a region of intersection that is to be tested is not required for subsequent repair because the presence of just one faulty memory cell is sufficient to initiate a repair.

In accordance with a further feature of the invention, the region of intersection of one of the groups of column lines and one of the groups of row lines the, memory cells are successively tested along column lines or row lines.

In another embodiment of the method, to test the memory cells within the region of intersection, initially the second address part of the column address is incremented, and, after the relevant row line has been fully tested, the second address part of the row address is incremented. To ascertain the group that needs to be tested next, the first address part of the column address is incremented. This means that testing is carried out locally along row lines within the region of intersection, with the row lines within the region of intersection being processed successively. The procedure then continues with the next group of column lines.

Accordingly, by changing the addressing sequence, another embodiment of the method provides that, to test the memory cells within the region of intersection, first the second address part of the column address is incremented, and, after the relevant row line has been fully tested, the second address part of the row address is incremented, with the first address part of the row address being incremented in order to ascertain the group which needs to be tested next. This means that addressing takes place locally within the region of intersection in the same sequence as in the previously described embodiment of the method, but the next group of row lines is addressed as the next group that needs to be tested.

In accordance with another mode of the invention, to test the memory cells within the region of intersection, initially the second address part of the row address is incremented, and, after the relevant column line has been fully tested, the second address part of the column address is incremented. To ascertain the group that needs to be tested next, the first address part of the column address is incremented.

In accordance with another mode of the invention, to test the memory cells within the region of intersection, initially the second address part of the row address is incremented. And, after the relevant column line has been fully tested, the second address part of the column address is incremented. To ascertain the group that needs to be tested next, the first address part of the row address is incremented.

The addressing unit of the memory according to the invention is configured such that the addresses of the memory cells can be generated in the sequence described. The addresses of the memory cells, which are each split into a first address part and a second address part, are generated by separate cooperating counters. In this context, the respective counters are driven in a suitable manner by the addressing unit. The respective address parts for the memory cells can go be tapped off at the outputs of the respective counters.

In accordance with another feature of the invention, the memory has a first counter for generating the first address part of the row address, a second counter for generating the second address part of the row address, a third counter for generating the first address part of the column address, and a fourth counter for generating the second address part of the column address. This configuration is used to produce the respective address parts of the column address and row address independently of one another under the control of the addressing unit.

In another embodiment of the integrated memory, the integrated memory has a first counter for generating the first address part of the row address and column address, and a second counter for generating the second address part of the row address and column address.

For the counters used, any form of a finite automaton may be used provided that the automaton runs through all possible states and hence through all subaddresses. These include, in particular, linear counters, Gray code counters or shift registers with feedback and specific forms of cellular automatons.

To carry out the various embodiments of the method that are described, the addressing unit can advantageously be operated in a respective one of a plurality of settable operating modes. These differ in terms of the addressing sequence of the memory cells that are to be tested.

Although the invention is illustrated and described herein as embodied in an integrated memory and method for checking the operation of memory cells in an integrated memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 4 is a schematic view of an embodiment of the memory;

FIG. 5 is a schematic view of an embodiment of the memory;

FIG. 6 is a schematic view of an embodiment of the memory; and

FIG. 7 is a schematic view of an embodiment of the memory.

DESCRIPTION OF THE PREFERRED EMBODIMENTS

Figure 1:
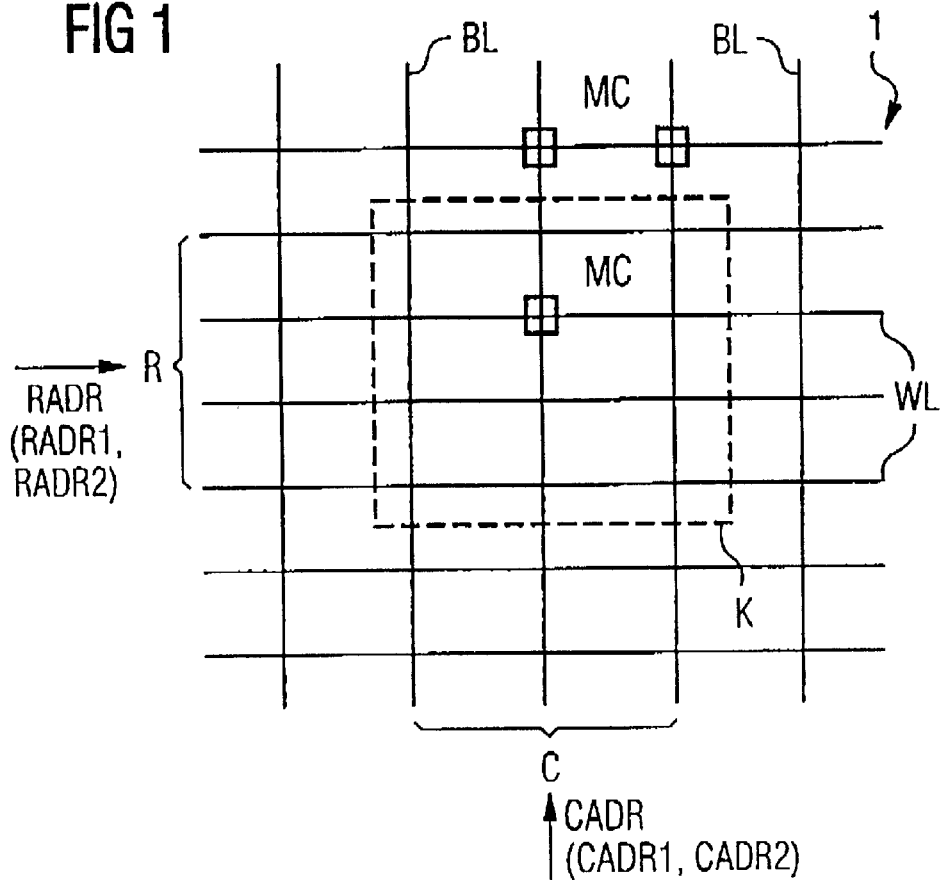
FIG. 1 is a schematic illustration of a matrix-like memory cell array of an integrated memory.

In all the figures of the drawing, sub-features and integral parts that correspond to one another bear the same reference symbol in each case.

Referring now to the figures of the drawings in detail and first, particularly to FIG. 1 thereof, there is shown a memory cell array 1, organized in matrix form, of a DRAM, for example, which has row or word lines WL and column or bit lines BL at whose points of intersection memory cells MC are disposed. The memory cells MC of the memory shown in this case each contain a selection transistor and a storage capacitor. In this embodiment, control inputs of the selection transistors are connected to one of the word lines WL, while a main current path of the selection transistors is disposed between the storage capacitor of the respective memory cell MC and one of the bit lines BL. The row lines WL and column lines BL are combined to form groups of row lines R and groups of column lines C. The group of row lines R (row group) and the group of column lines C (column group) intersect in the region of intersection K.

The memory cells MC can each be addressed using column addresses CADR and row addresses RADR. The column addresses CADR and row addresses RADR of the memory cells MC each have a first address part CADR1, RADR1 that can be used to address the respective column group C or row group R. The addresses also have a second address part CADR1, RADR2 that can be used to address the memory cells MC within the respective groups C and R.

Figure 2:
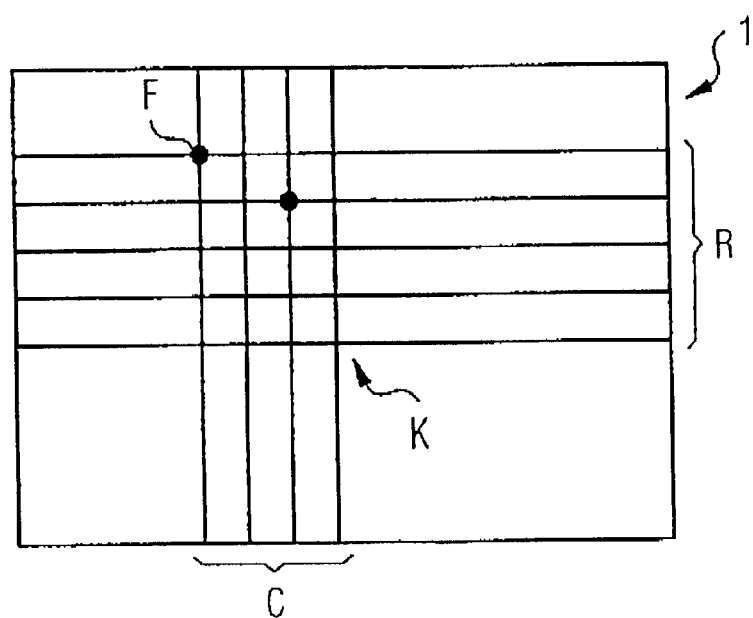
FIG. 2 is another schematic illustration of the memory cell array with groups of column lines and row lines.

During the check on the operation of the memory cells MC in the region of intersection K, the memory cells MC are successively tested to ensure that there are no faults. In this context, faults that are characterized by a different position both in the column direction and in the row direction may arise in the region of intersection K. These faults are shown as fault locations F in FIG. 2. The memory cells MC in the region of intersection K are distinguished in that the first address parts RADR1 and CADR1 of their addresses match. Splitting the addresses of the memory cells MC into a first address part and a second address part splits each of the addresses of the memory cells MC into a "global" and a "local" subaddress. The global row/column address RADR1 or CADR1 is the address of the row/column group R or C that can be replaced in the memory cell array 1. The local row/column address RADR2 or CADR2 determines the position of the addressed memory cell or of the addressed memory word within the respective row/column group R or C. This permits all the cells in the region of intersection K of a row and column group to be tested first before the procedure continues with the next group in the row or column direction by changing the global row or column address.

In this context, first all the memory cells MC or memory words in the region of intersection K of the row group R and column group C are tested. In this case, the addresses of faulty memory cells MC in the region of intersection K can be compressed by comparing the global row address RADR1 and column address CADR1 of successive fault addresses. If a plurality of successive fault addresses have an identical global row address RADR1 and column address CADR1, only the first fault address, for example, is forwarded to a redundancy analysis unit located, by way of example, outside the integrated memory. The addresses of other faulty memory cells are not processed further for evaluation purposes. Because all the memory cells MC having an identical global row address RADR1 and column address CADR1 are tested in direct succession, compaction takes place over all fault addresses in the region of intersection K of the row group R and column group C. Because faults having different column and row addresses are compressed, compaction takes place in two dimensions, by contrast with one-dimensional compaction, where only fault addresses having an identical column or row address are compressed.

Figure 3A:
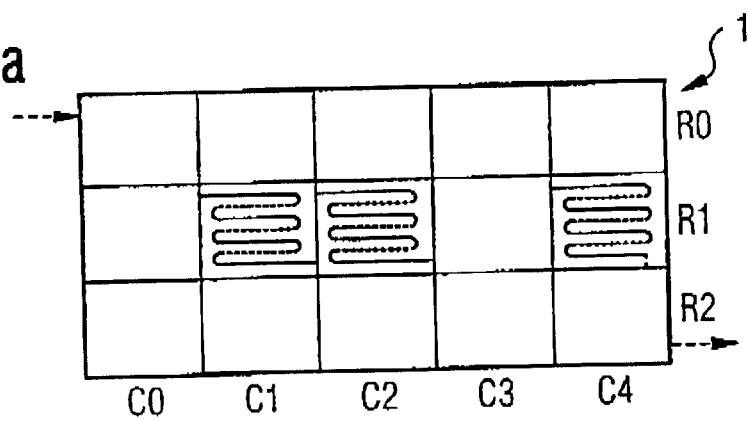
FIGS. 3a–d are schematic illustrations of the addressing sequences of embodiments of the method according to the invention.

The addressing cycle during an operation test is explained by way of example using FIG. 3a. The memory cells in the region of intersection of the groups R1 and C1 are tested. First, the local column address CADR2 is increased and, after the row in question has been fully tested, the local row address RADR2 is increased until all the memory cells in the region of intersection have been tested. The region of intersection of the groups R1 and C2 is tested as the next group that needs to be tested. Thus, the global column address CADR1 is increased.

In this case, the directional preference of the addressing sequence can be stipulated independently at local and global level. The various addressing sequences are shown schematically in FIGS. 3a to 3d. In this case, a different prioritization is implemented during subaddress generation. The various prioritizations for subaddress generation are listed in the table below in line with FIGS. 3a to 3d.

TABLE

Prioritization for subaddress generation

| Figure | Row address | | Column address | | Increment |
|---|---|---|---|---|---|
| | RADR1 | RADR2 | CADR1 | CADR2 | |
| 3a | 4 | 2 | 3 | 1 | Locally, CADR first, globally, CADR first |
| 3b | 3 | 2 | 4 | 1 | Locally, CADR first, globally, RADR first |
| 3c | 4 | 1 | 3 | 2 | Locally, RADR first, globally, CADR first |
| 3d | 3 | 1 | 4 | 2 | Locally, RADR first, globally, RADR first |

(1 = first in time, 4 = last in time)

A redundancy concept that can be used to repair the integrated memory stipulates that a column group C or row group R of the memory cell array 1 is always replaced when there is a fault in a memory cell MC. In this case, a repair is initiated if one or more arbitrary memory cells MC in the region of intersection K fail. This means that it is no longer relevant for subsequent repair that, once a faulty memory cell has been detected, addresses of other faulty memory cells are forwarded to the redundancy analysis unit if they belong to the same region of intersection K.

So that the data transmission rate for an operation check, which can require the transmission of large quantities of data, is not limited by the number of available connections of the memory, it is customary to provide a self test unit, which carries out the operation check, on the same integrated circuit as that on which the memory is located. Such an implementation is also called a "Built-In Self Test" (BIST).

FIGS. 4–7 show embodiments of a memory according to the invention. The illustrative embodiments each have an addressing unit 2 for addressing memory cells MC that are to be tested. Connected to the respective addressing unit 2 are counters 11 to 18 which each have control inputs L1 to L4 which are connected to outputs A1 to A4 of the addressing unit 2. In addition, each of the counters 11 to 18 has a status signal ST that is returned to the addressing unit 2. The respective address parts of the addresses RADR and CADR of the memory cells MC that are to be tested can be tapped off at the outputs of the respective counters 11 to 18.

The addressing unit 2 is also connected to a self test unit 3 having control connections S0 to S4 for controlling the addressing operations. By way of example, a signal for setting an addressing sequence in accordance with FIGS. 3a to 3d is applied to the control connection S0. The addressing unit 2 can thus be operated in a respective one of a plurality of accessible operating modes that differ in terms of the addressing sequence of the memory cells MC that are to be tested. The control connection S1 has a "Hold" signal applied to it. The hold signal tells the respective counter to retain a particular value. The control connection S2 can be used to set whether the respective counter counts in an up or down sequence. The control connections S3 and S4 are connections for Set and Reset signals, respectively. The respective signals on the control connections S1 to S4 are forwarded to the respective outputs A1 to A4 of the addressing unit 2 under the control of the addressing unit 2.

The addressing unit 2 therefore drives the counters 11 to 18 such that the memory cells MC in the region of intersection K of a column group C and a row group R can be successively addressed. Then, memory cells MC of a further column group C or row group R can be addressed.

In FIG. 4, the integrated memory has a counter 11 for generating the first address part of the row address RADR1, a counter 12 for generating the second address part of the row address RADR2, a counter 13 for generating the first address part of the column address CADR1, and a counter 14 for generating the second address part of the column address CADR2.

Figure 3B:
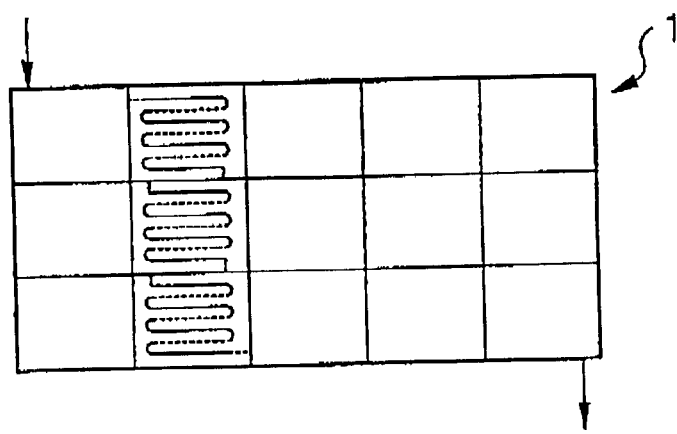
Figure 3C:
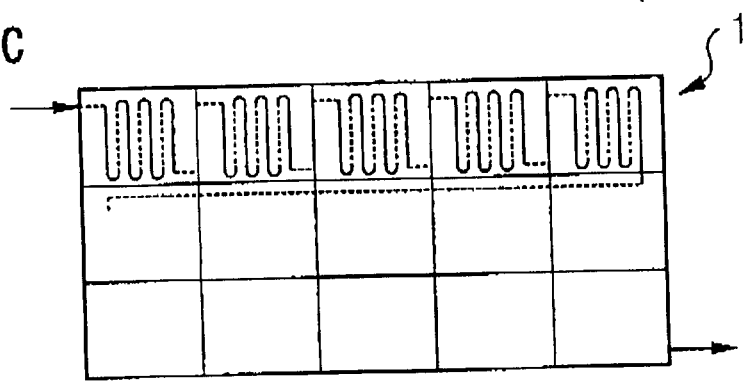
Figure 3D:
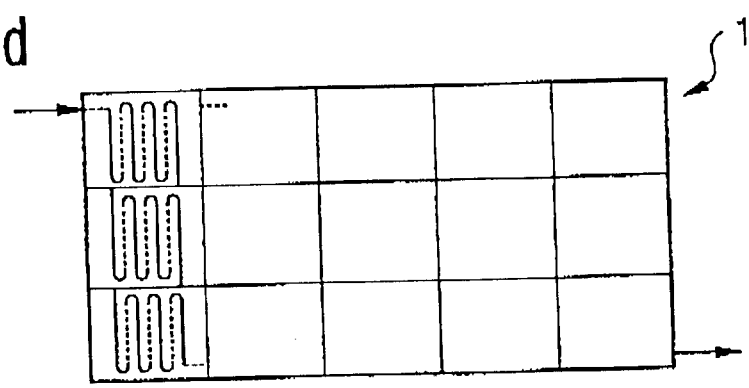

If the addressing modes of FIGS. 3c and 3d are excluded, then the configuration shown in FIG. 4 is simplified in line with the configuration shown in FIG. 5. In this case, the row address counters 11 and 12 are combined to form a joint row address counter 17. The respective first and second address parts RADR1 and RADR2 of the row address can be tapped off at the row address counter 17.

If the addressing modes shown in FIGS. 3a and 3b are excluded, then the configuration shown in FIG. 4 is simplified in line with the configuration shown in FIG. 6. In this case, the column address counters 13 and 14 are combined to form a joint column address counter 18. The respective first address parts and second address parts CADR1 and CADR2 of the column address can be tapped off at the column address counter 18.

On the basis of the configuration shown in FIG. 7, the integrated memory has a counter 15 for generating the first address part RADR1 and CADR1 of the row address and column address, and a counter 16 for generating the second address part RADR2 and CADR2 of the row address and column address. The counters 15 and 16 thus denote a "global" address counter 15 and a "local" address counter 16, at which the respective row and column addresses can be tapped off.

The method described above for checking the operation of memory cells can be carried out using the described inventive integrated memory and the illustrative embodiments of the integrated memory which are shown. To this end, the control inputs of the addressing unit 2 are connected, by way of example, to a microcontroller of the integrated memory, which carries out the operation test, for example under external control. In another embodiment, the control inputs of the addressing unit 2 are connected to a self test unit 3 of the integrated memory, as described above. Solutions are also conceivable, however, in which the memory cells tested on the basis of the method according to the invention are addressed ad directly by the microcontroller, for example. These solutions thus require no addressing unit 2 for controlling an addressing sequence when carrying out an operation test.

We claim:

1. A method for checking the operation of memory cells in an integrated memory, which comprises:
   providing an integrated memory having addressable memory cells in a matrix-like memory cell array along column lines and row lines; the memory cells combined to form groups of column lines and row lines each addressed with column addresses and row addresses; each of the column addresses and row addresses including an address part addressing the respective groups of column lines and row lines;
   successively testing the memory cells in an intersection of one of the groups of column lines and one of the groups of row lines for faults, and then testing memory cells of another group of column lines or row lines;
   comparing faulty respective address parts of the memory cells recognized as being faulty;

further processing the address of a faulty memory cell if a address part of the faulty memory cell matches another address part of another faulty memory cell, and not further processing the addresses of other faulty memory cells.

2. The method according to claim 1, which further comprises successively testing the memory cells within the intersection by successively testing along column lines.

3. The method according to claim 1, which further comprises successively testing the memory cells within the intersection are successively tested along row lines.

4. The method according to claim 1, which further comprises addressing the memory cells within at least one of the groups with a further address part.

5. The method according to claim 4, which further comprises:

testing the memory cells within the intersection by incrementing the further address part of the column address, and, incrementing the further address part of the row address after the relevant row line has been fully tested; and ascertaining the group needing to be tested next by incrementing the address part of the column address.

6. The method according to claim 4, which further comprises:

testing the memory cells within the intersection by incrementing the further address part of the column, and, after the relevant row line has been fully tested, incrementing the further address part of the row;

incrementing the address part of the row address to ascertain the group needing to be tested next.

7. The method as claimed in claim 4, which further comprises:

incrementing the further address part of the row address, and, after testing the relevant column line, incrementing the further address part of the column address to test the memory cells within the region of intersection; and incrementing the address part of the column address to ascertain the group that needs to be tested next.

8. The method according to claim 4, which further comprises:

incrementing the further address part of the row address, and, after the relevant column line has been fully tested, incrementing the further address part of the column address to test the memory cells within the intersection; and incrementing the address part of the row address to ascertain the group that needs to be tested next.

9. An integrated memory to be subjected to a memory cell test to ascertain operable and faulty memory cells, comprising:

addressable memory cells in a matrix-like memory cell array, said addressable memory cells disposed along column lines and row lines;

said memory cells combined to form groups of column lines and row lines, each being addressed using respective column addresses and row addresses;

said column addresses and said row addresses each including a first address part addressing a respective group of said column lines and said row lines, and a second address part addressing memory cells within said respective group;

a respective counter generating said first address part and a respective further counter generating said second address part, each having control inputs connected to outputs of an addressing unit;

said respective first address parts and second address parts of said memory cells to be tested to be tapped off at said output of a respective counter;

said addressing unit driving said counters for the purpose of addressing memory cells to be tested, for successively addressing said memory cells in an intersection of one of said groups of column lines and of one of said groups of row lines are successively addressed, and then addressing memory cells having at least one of another group of column lines and row lines.

10. The integrated memory according to claim 9, including:

a first counter generating said first address part of said row address;

a second counter generating said second address part of said row address;

a third counter generating said first address part of said column address; and a fourth counter generating said second address part of said column address.

11. The integrated memory according to claim 9, including:

a first counter generating said first address part of said row address and column address; and a second counter generating said second address part of said row address and column address.

12. The integrated memory according to claim 9, wherein said counters are linear counters.

13. The integrated memory according to claim 9, wherein said counters are Gray code counters.

14. The integrated memory according to claim 9, wherein said counters are linear counters.

15. The integrated memory according to claim 9, wherein said counters are shift registers with feedback.

16. The integrated memory according to claim 9, wherein said addressing unit is to be operated in a respective one of a plurality of settable operating modes differing in terms of the addressing sequence of the memory cells to be tested.

17. The integrated memory according to claim 9, including a self test unit connected to control inputs of said addressing unit, said control inputs controlling the addressing operation.

* * * * *